United States Patent [19]
Suzuki

[11] Patent Number: 6,121,844
[45] Date of Patent: Sep. 19, 2000

[54] PLL FREQUENCY SYNTHESIZER AND METHOD FOR CONTROLLING THE PLL FREQUENCY SYNTHESIZER

[75] Inventor: Hiroshi Suzuki, Tokyo, Japan

[73] Assignee: Mitsubishi Denki Kabushiki Kaisha, Tokyo, Japan

[21] Appl. No.: 09/242,060

[22] PCT Filed: Jul. 24, 1997

[86] PCT No.: PCT/JP97/02570

§ 371 Date: Feb. 8, 1999

§ 102(e) Date: Feb. 8, 1999

[87] PCT Pub. No.: WO99/05792

PCT Pub. Date: Feb. 4, 1999

[51] Int. Cl.[7] .................................. H03L 7/08; H03L 7/18
[52] U.S. Cl. ........................... 331/17; 331/176; 331/179; 331/14; 327/159; 375/376
[58] Field of Search ................... 331/17, 14, 1 A, 331/176; 327/159, 160; 375/376

[56] References Cited

U.S. PATENT DOCUMENTS 5,334,952   8/1994   Maddy et al. ........................... 331/1 A

FOREIGN PATENT DOCUMENTS 5-90962   4/1993   Japan .
6-125270   5/1994   Japan .
8-51360   2/1996   Japan .

*Primary Examiner*—Arnold Kinkead
*Attorney, Agent, or Firm*—Rothwell, Figg, Ernst & Manbeck

[57] ABSTRACT

A PLL frequency synthesizer is provided with: a voltage detector (9) for detecting the current value of a control voltage to be applied to a voltage-controlled oscillator (6); a storage device (7) which has prestored therein a plurality of set values of control voltages corresponding to a plurality of set values of frequency dividing numbers to be set in a frequency divider (2) and which selects that one of the plurality of set values of control voltages which corresponds to the frequency dividing number set in the frequency divider; voltage value comparator (8) for comparing the current value of the control voltage detected by the voltage detector (6) and the set value of the control voltage output from the storage device (7); and a switching circuit (10) whereby a phase difference signal indicative of the phase difference between a frequency-divided signal from the frequency divider (2) and a reference frequency signal, generated by a phase comparator (3), and the output signal from the voltage value comparator (8) are selectively switched for application to a charge pump (4). The voltage value comparator (8) controls the switching circuit (10) to drive the charge pump (4) by the output signal from the comparator itself when the difference between the detected current value of the control voltage and the set value of the control voltage read out of the storage device (7) is greater than a predetermined value, and at all other times, by the phase difference signal from the phase comparator (3).

9 Claims, 9 Drawing Sheets

PLL FREQUENCY SYNTHESIZER AND METHOD FOR CONTROLLING THE PLL FREQUENCY SYNTHESIZER

TECHNICAL FIELD

The present invention relates to a PLL frequency synthesizer, which is used in a cellular telephone or similar mobile telephone to switch frequencies at high speed, and a method for controlling the PLL frequency synthesizer.

TECHNICAL FIELD

FIG. 1 is a block diagram depicting the construction of an example of a conventional PLL frequency synthesizer disclosed, for example, in Japanese Patent Laid-Open Gazette No. 125270/94. In FIG. 1, reference numeral 1 denotes a reference oscillator which generates a reference frequency signal of a reference frequency; 2 denotes a frequency divider for dividing the frequency of the output from a voltage-controlled oscillator 6; 3 denotes a phase comparator which compares the phase of the reference frequency signal from the reference oscillator 1 and the phase of the frequency-divided signal from the frequency divider 2 and outputs a phase difference signal of a value corresponding to the detected phase difference; 4 denotes a charge pump which is driven by the phase difference signal from the phase comparator 3 and outputs a pulse signal of a width corresponding to the phase difference between the reference frequency signal and the frequency-divided signal; and 5 denotes a loop filter which smoothes the pulse signal from the charge pump 4 and applies it as a control signal to the voltage-controlled oscillator 6.

Next, the operation of the above prior art example will be described below.

The output signal from the voltage-controlled oscillator 6, which has a desired frequency, is frequency divided by the frequency divider 2 in accordance with the frequency dividing number set therein. When supplied with the reference frequency signal available from the reference oscillator 1 and the frequency-divided signal, the phase comparator 3 compares the phases of these signals and outputs, to the charge pump, a phase difference signal of a value corresponding to the phase difference. The charge pump 4 is driven by the phase difference signal from the phase comparator 3 and outputs, to the loop filter 5, a pulse signal of a width corresponding to the phase difference between the reference frequency signal and the frequency-divided signal. The loop filter 5 smoothes the pulse signal from the charge pump 4 and outputs a control voltage for controlling the voltage-controlled oscillator 6. When the loop filter 5 receives the pulse signal from the charge pump 4, a capacitor in the loop filter 5 is charged or charges stored in the capacitor are discharged. As the result of this, the control voltage varies which is applied to the voltage-controlled oscillator 6. Thus, when there is a phase difference between the reference frequency signal from the reference oscillator 1 and the frequency-divided signal from the frequency divider 2, the charge pump 4 outputs a pulse signal of a width corresponding to the phase difference; hence, the control voltage to be fed to the voltage-controlled oscillator 6 varies and the frequency of the output signal from the voltage-controlled oscillator 6 varies accordingly. This operation is continued until no phase difference is detected between the reference frequency signal and the frequency-divided signal. When the phase difference is no more detected, the PLL frequency synthesizer enters its frequency-locked state; the frequency of the output signal from the voltage-controlled oscillator 6 at this time becomes equal to a value of multiplication of the frequency of the reference frequency signal by the frequency dividing number set in the frequency divider 2. Accordingly, the output signal from the voltage-controlled oscillator 6 can be set at a frequency of an integral multiple of the reference frequency signal by changing the frequency dividing number (an integer) that is set in the frequency divider 2.

Since the conventional PLL frequency synthesizer has such a construction as described above, there is a problem that phase noise of the output signal from the voltage-controlled oscillator 6 and spurious components occurring near the desired frequency will increase if the loop filter 5 does not sufficiently smooth the pulse signal from the charge pump 4 to generate the control voltage for the voltage-controlled oscillator 6. A possible solution to this problem is to adapt the loop filter 5 for sufficient smoothing operation, but this requires the time constant of the loop filter 5 to be large. In general, however, when the time constant of the loop filter 5 is large, much time is needed for transition of the system from its non-frequency-locked state to its frequency-locked state. Accordingly, the adaptation of the loop filter 5 for sufficient smoothing operation will result in an increase in the time of transition by changing the frequency dividing number to change the frequency of the output signal. That is, the response to frequency switching slows down. Conversely, a quick response to frequency switching is inevitably accompanied by an increase in phase noise and spurious components. Thus, in the conventional PLL frequency synthesizer the suppression of the phase noise and the spurious components and the speedup of the response to frequency switching bear what is called a tradeoff relationship; it is difficult to cope with both of them.

The present invention is intended to solve such a problem as mentioned above, and has for its object to provide a PLL frequency synthesizer which employs a loop filter of a large time constant but permits fast frequency switching while suppressing the occurrence of phase noise and spurious components.

DISCLOSURE OF THE INVENTION

A PLL frequency synthesizer according to the invention described in claim 1 comprises: voltage detecting means for detecting the current value of a control voltage to be applied to a voltage-controlled oscillator; storage means which has prestored therein a table indicating the correspondence between a plurality of set values of frequency dividing numbers to be set in a frequency divider and a plurality of set values of control voltages to be applied to the voltage-controlled oscillator and which reads out of the table the set value of the control voltage corresponding to the frequency dividing number set in the frequency divider and outputs the read-out set value; voltage value comparison means which compares the current value of the control voltage detected by the voltage detecting means and the set value of the control voltage output from the storage means and outputs the comparison result and generates an output signal corresponding to the set value; switching means whereby a phase difference signal indicative of the phase difference between a frequency-divided signal from the frequency divider and a reference frequency signal, generated by a phase comparator, and the output signal from the voltage value comparison means are selectively switched for application to a charge pump; and control means which controls the switching means to drive the charge pump by the output signal from the voltage value comparison means when the comparison result indicates that the difference between the detected current value of the control voltage and the set value of the control voltage read out of the storage means is greater than a predetermined value, and at all other times, by the phase difference signal from the phase comparator.

With such an arrangement, the current and the set value of the control voltage are compared, and the output frequency of the voltage-controlled oscillator is changed to reduce the difference between it and the desired frequency. And, when the difference between the current and the set value of the control voltage has approached a predetermined range of value, the comparison of the current and set values of the control voltage is switched to the comparison of the reference frequency signal and the output signal from the voltage-controlled oscillator as in the prior art example, by which the synthesizer can eventually be converged to its frequency-locked state. Hence, it is possible to combine short-time frequency switching, high frequency stability in the frequency-locked state and the suppression of phase noise and spurious components.

A PLL frequency synthesizer according to the invention described in claim 2 further comprises temperature detecting means for detecting the temperature of the voltage-controlled oscillator or ambient temperature; and the storage means has prestored therein a table indicating the correspondence of a plurality of set values of frequency dividing numbers and a plurality of set values of control voltages with a plurality of temperature conditions, and the storage means reads out of the table the set value of the control voltage corresponding to particular temperature information from the temperature detecting means and a particular frequency dividing number being set and provides the read-out set value to the voltage value comparison means.

With such an arrangement, even if the temperature of the voltage-controlled oscillator or ambient temperature changes during operation, it is possible to prevent the PLL frequency synthesizer from being unable to become frequency-locked and maintain a quick response to frequency switching.

A PLL frequency synthesizer according to the invention described in claim 3 further comprises rewrite control means whereby, when the PLL frequency synthesizer has reached its frequency-locked state, the set value of the control voltage stored in the storage device 7 and corresponding to the currently set frequency dividing number is rewritten with the current value of the control voltage detected by the voltage detector.

With such an arrangement, since the set value of the control voltage is updated with the latest value, it is possible to automatically correct for secular changes in the system characteristics.

A PLL frequency synthesizer according to the invention described in claim 4 controls the switching means by the control means to drive the charge pump by the phase difference signal from the phase comparator only when the frequency-divided signal and the reference frequency signal have become in-phase with each other after the difference between the current value of the control voltage detected by the voltage detecting means and the set value of the control voltage provided from the storage means became smaller than the predetermined value.

With such an arrangement, it is possible to suppress fluctuations in the control voltage which may occur when the switching means is controlled—this makes the frequency switching response faster.

A PLL frequency synthesizer control method according to the invention described in claim 5 comprises: a control voltage detecting step of detecting the current value of a control voltage; a storing step of prestoring a table indicating the correspondence between a plurality of set values of frequency dividing numbers to be set in a frequency divider and a plurality of set values of control voltages to be applied to a voltage-controlled oscillator; a readout step of reading out of the prestored table the set value of the control voltage corresponding to the frequency dividing number currently set in the frequency divider; a comparison step of comparing the read-out set value and the current value of the control voltage being detected; and a charge pump driving step of driving a charge pump by a signal of a value corresponding to the set value of the control voltage in place of a phase difference signal from a phase comparator when it is found in the comparison step that the difference between the detected current value of the control voltage and the set value of the control voltage is large, and at all other times, by the phase difference signal from the phase comparator.

With such a method, it is possible to combine short-time frequency switching, high frequency stability in the frequency-locked state and the suppression of phase noise and spurious components.

A PLL frequency synthesizer control method according to the invention described in claim 6 further comprises a step of detecting the temperature of the voltage-controlled oscillator or ambient temperature, and in the storing step, prestores a table indicating the correspondence of a plurality of set values of frequency dividing numbers and a plurality of set values of control voltages with a plurality of temperature conditions, and in the readout step, reads out of the prestored table the set value of the control voltage corresponding to detected temperature and the currently set frequency dividing number.

With such a method, even if the temperature of the voltage-controlled oscillator changes during operation, it is possible to prevent the PLL frequency synthesizer from becoming impossible of getting frequency-locked and maintain a quick response to frequency switching.

A PLL frequency synthesizer control method according to the invention described in claim 7 further comprises a rewriting step of rewriting the stored set value of the control voltage corresponding to the currently set frequency dividing number with the detected current value of the control voltage when the PLL frequency synthesizer has reached its frequency-locked state.

With such a method, since the set value of the control voltage is updated with the latest value, it is possible to automatically correct for secular changes in the system characteristics.

A PLL frequency synthesizer control means according to the invention described in claim 8 has its feature in that the charge pump driving step is a step of driving the charge pump by the phase difference signal from the phase comparator only when the frequency-divided signal and the reference frequency signal have become in-phase with each other after the difference between the detected current value of the control voltage and the read-out set value of the control voltage became small.

With such a method, it is possible to suppress fluctuations in the control voltage which may occur when the switching means is controlled—this makes the frequency switching response faster.

BEST MODE FOR CARRYING OUT THE INVENTION

To describe the present invention in more detail, the best mode for carrying out the invention will hereinafter be described with reference to the accompanying drawings.

Embodiment 1

Figure 1:
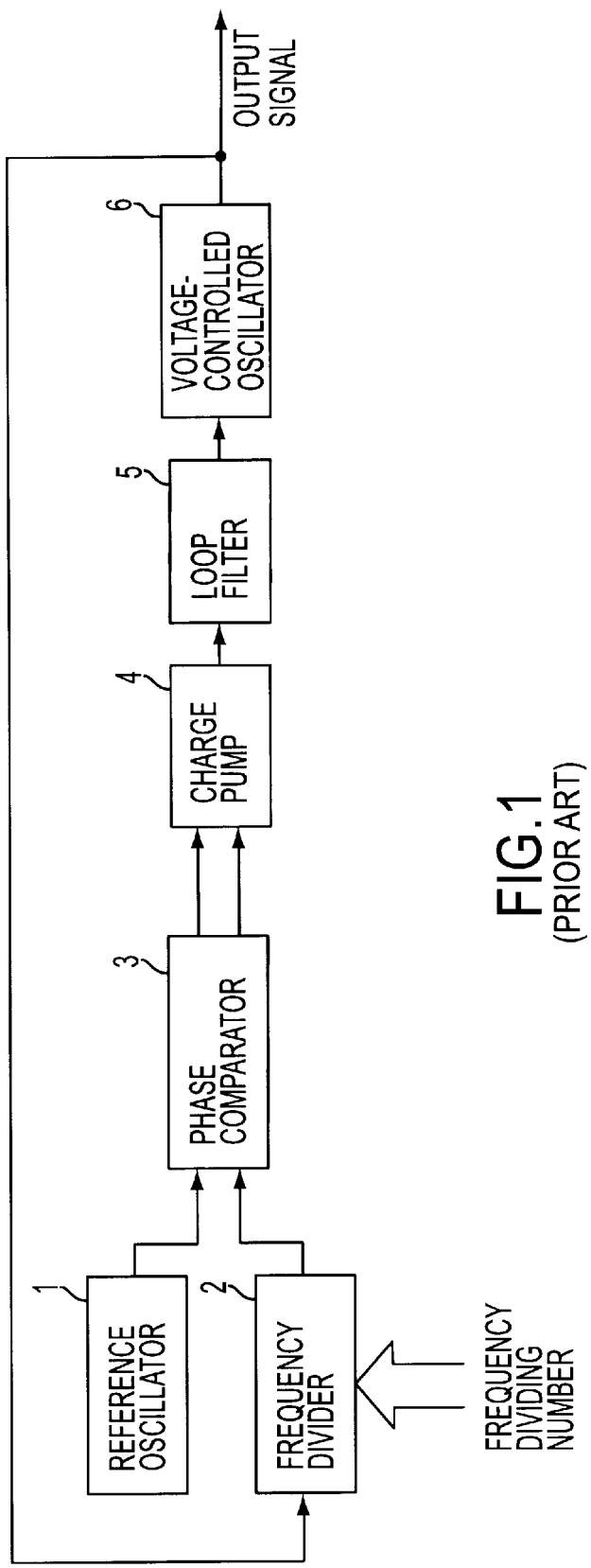
FIG. 1 is a block diagram depicting the construction of a conventional PLL frequency synthesizer.
Figure 2:
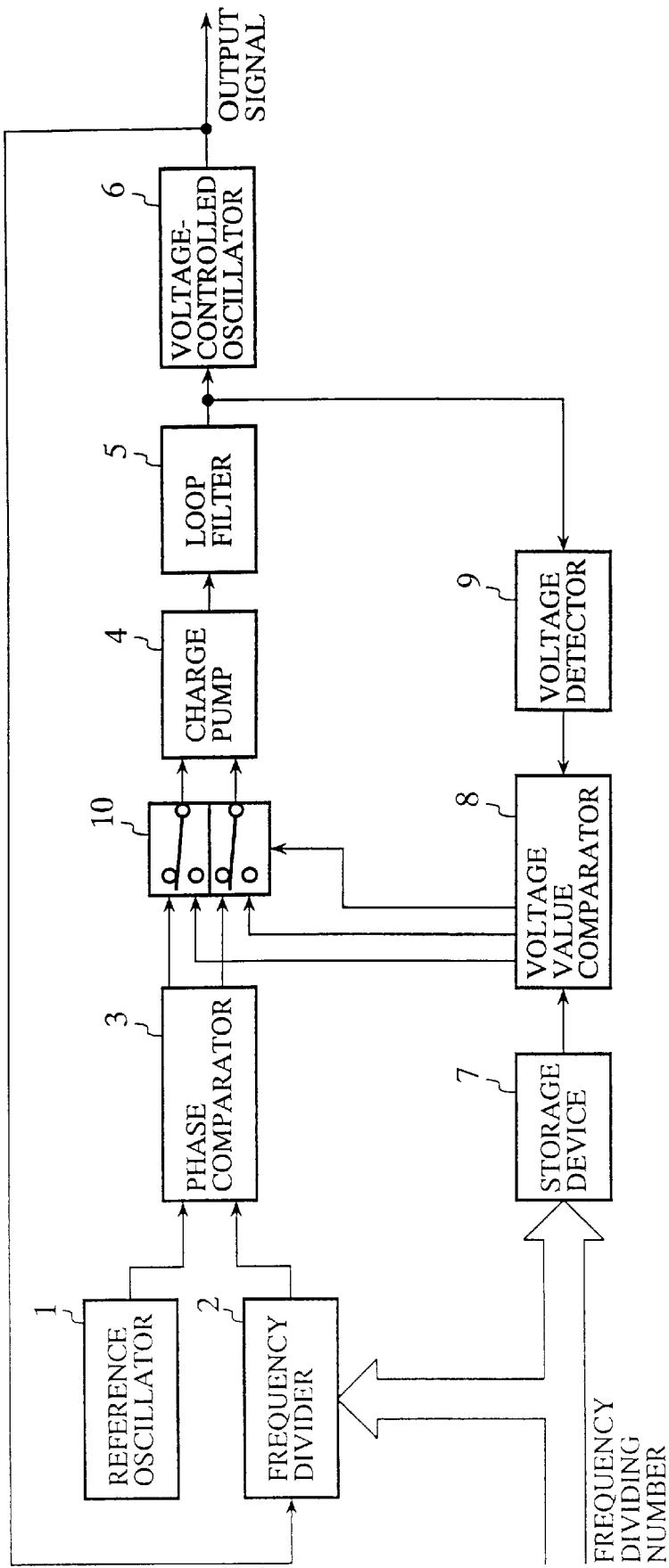
FIG. 2 is a block diagram illustrating a PLL frequency synthesizer according to Embodiment 1 of the present invention.

FIG. 2 is a block diagram illustrating a PLL frequency synthesizer according to Embodiment 1 of the present invention. In FIG. 1, reference numeral 1 denotes a reference oscillator for generating a reference frequency signal which has a reference frequency; 2 denotes a frequency divider for dividing the frequency of the output signal from a voltage-controlled oscillator 6; 3 denotes a phase comparator which compares the phase of the reference frequency signal available from the reference oscillator 1 and the phase of the frequency-divided signal from the frequency divider 2 and outputs a phase difference signal of a value corresponding to the phase difference; 4 denotes a charge pump which is driven by the phase difference signal available from the phase comparator 3 and outputs a pulse signal of a width corresponding to the phase difference between the reference frequency signal and the frequency-divided signal; and 5 denotes a loop filter which smoothes the pulse signal available from the charge pump 4 and outputs its as a control signal to the voltage-controlled oscillator 6. Reference numeral 7 denotes a storage device (storage means) wherein there is prestored a table indicating the correspondence between a plurality of set values of frequency dividing numbers to be set in the frequency divider 2 so as to obtain a desired frequency and a plurality of set values of control voltages to be applied to the voltage-controlled oscillator 6 so as to obtain a desired frequency; and 8 denotes a voltage value comparator (voltage value comparison means, control means) which compares the set value of the control voltage input thereinto from the storage device 7 and the current value of the control voltage detected by a voltage detector (voltage detecting means) 9 and, when the difference is larger than a predetermined threshold value, switches a switching circuit (switching means) 10 to connect the input of the charge pump 4 to the output of the voltage value comparator itself. Incidentally, the time constant of the loop filter 5 of the PLL frequency synthesizer according to the present invention is large enough to sufficiently suppress the phase noise and spurious components.

Next, the operation of this embodiment will be described below.

Immediately after the frequency dividing number is set in the frequency divider 2 to obtain a desired frequency, the frequency of the output signal from the voltage-controlled oscillator 6 differs from the desired frequency. As already described, in the conventional PLL frequency synthesizer, when frequency is switched, a comparison is made by the phase comparator 3 between the phase of the frequency-divided signal from the frequency divider 2 and the phase of the reference frequency signal, and the frequency of the output signal from the voltage-controlled oscillator 6 is gradually changed so that the difference between the desired frequency and the frequency of the output signal from the voltage-controlled oscillator decreases, ultimately leading the synthesizer to its frequency-locked state. By the way, the instantaneous phase relationship between the frequency-divided signal from the frequency divider 2 and the reference frequency signal does not uniquely depend on the relationship of their frequencies. Since the above-mentioned comparison for bringing the frequency of the output signal from the voltage-controlled oscillator 6 close to the desired frequency is made therefore based on phase, not on frequency or control voltage, the frequency of the output signal from the voltage-controlled oscillator 6 tends to gradually approach the desired frequency while fluctuating, and consumes a redundant amount of time for its convergence to the desired value. As referred to above, this time increases with an increase in the value of the time constant of the loop filter 5.

In contrast to the above, according to the present invention, based on the fact that the control voltage to be applied to the voltage-controlled oscillator and the frequency of its output signal have a unique correspondence with each other under certain conditions, there is prestored in the storage device 7 a table that indicate a unique correspondence between a plurality of set values of frequency dividing numbers to be set in the frequency divider 2 and a plurality of set values of control voltages to be applied to the voltage-controlled oscillator so as to obtain a desired frequency. This correspondence can be obtained by premeasuring operating characteristics of the PLL frequency synthesizer.

When supplied with the same value as the frequency dividing number to be set in the frequency divider 2, the storage device 7 reads out of the table the set value of the control voltage corresponding to the frequency dividing number being set, and provides the set value to the voltage value comparator 8. On the other hand, the voltage detector 9 detects the current value of the control voltage being applied from the loop filter 5 to the voltage-controlled oscillator 6, and provides the detected value to the voltage value comparator 8. The voltage value comparator 8 compares the set value of the control voltage input thereinto from the storage device 7 and the current value of the control voltage detected by the voltage detector 9, and determines if the difference is greater than a predetermined threshold value. When the difference is greater than the predetermined threshold value, the switching circuit 10 is switched to connect the input of the charge pump 4 to the output of the voltage value comparator 8. The voltage value comparator 8 drives the charge pump 4 in such a manner as to reduce the difference between the set value of the control voltage provided from the storage device 7 and the current value of the control voltage detected by the voltage detector 9 and hence change the control voltage that is fed from the loop filter 5 to the voltage-controlled oscillator 6, thereby bringing the frequency of the output signal from the voltage-controlled oscillator 6 close to a desired frequency.

Since the control voltage to be applied to the voltage-controlled oscillator 6 and the frequency of its output signal have a unique correspondence under certain conditions as mentioned above and since a temporarily transient response of the output signal frequency to a change of the control voltage is usually fast to such an extent as not to become an issue, the comparison of the current and set values of the control voltage is equivalent to an indirect comparison of frequencies. Based on the comparison result thus obtained, the frequency of the output signal from the voltage-controlled oscillator 6 can be made to approach the desired frequency without spending any redundant time.

In general, however, it is difficult to realize high frequency stability required of the PLL frequency synthesizer, only by the comparison between the set value of the control voltage and the current value of the control voltage applied to the voltage-controlled oscillator 6. Hence, when the difference between the set value of the control voltage provided from the storage device 7 and the current value of the control voltage detected by the voltage detector 9 has become smaller than the predetermined threshold value and the current value of the control voltage has approached a predetermined range of the set value, the operating condition of the PLL frequency synthesizer is switched to the comparison between the phase of the reference frequency signal from the reference oscillator 1 and the phase of the frequency-divided signal as is the case with the prior art example, thereby ultimately converging the PLL frequency synthesizer to its frequency-locked state. In other words, when the difference between the set value of the control voltage read out of the storage device 7 and the control voltage value detected by the voltage detector 9 has becomes smaller than the predetermined threshold value, the voltage value comparator 8 switches the switching circuit 10 to connect the input of the charge pump 4 to the output of the phase comparator 3. As a result, the PLL frequency synthesizer according to Embodiment 1 is switched to the same operation as in the prior art example. And, the difference between the frequency of the reference signal from the reference oscillator 1 and the frequency-divided signal from the frequency divider 2 eventually disappears and the PLL frequency synthesizer enters its frequency-locked state. The frequency of the output signal from the voltage-controlled oscillator 6 at this time is equal to a value of multiplication of the frequency of the reference frequency signal by the frequency dividing number set in the frequency divider 2.

As described above, according to Embodiment 1, the loop filter 5 of a large time constant is used to suppress the phase noise and spurious components, and when the difference between the set value of the control voltage provided from the storage device 7 and the current value of the control voltage detected by the voltage detector 9 is greater than a predetermined threshold value, the control voltage value is controlled based on the information prestored in the storage device 7—this permits high-speed frequency switching. It is also possible to obtain high frequency stability in the frequency-locked state and suppress the phase noise and spurious components.

Embodiment 2

Figure 3:
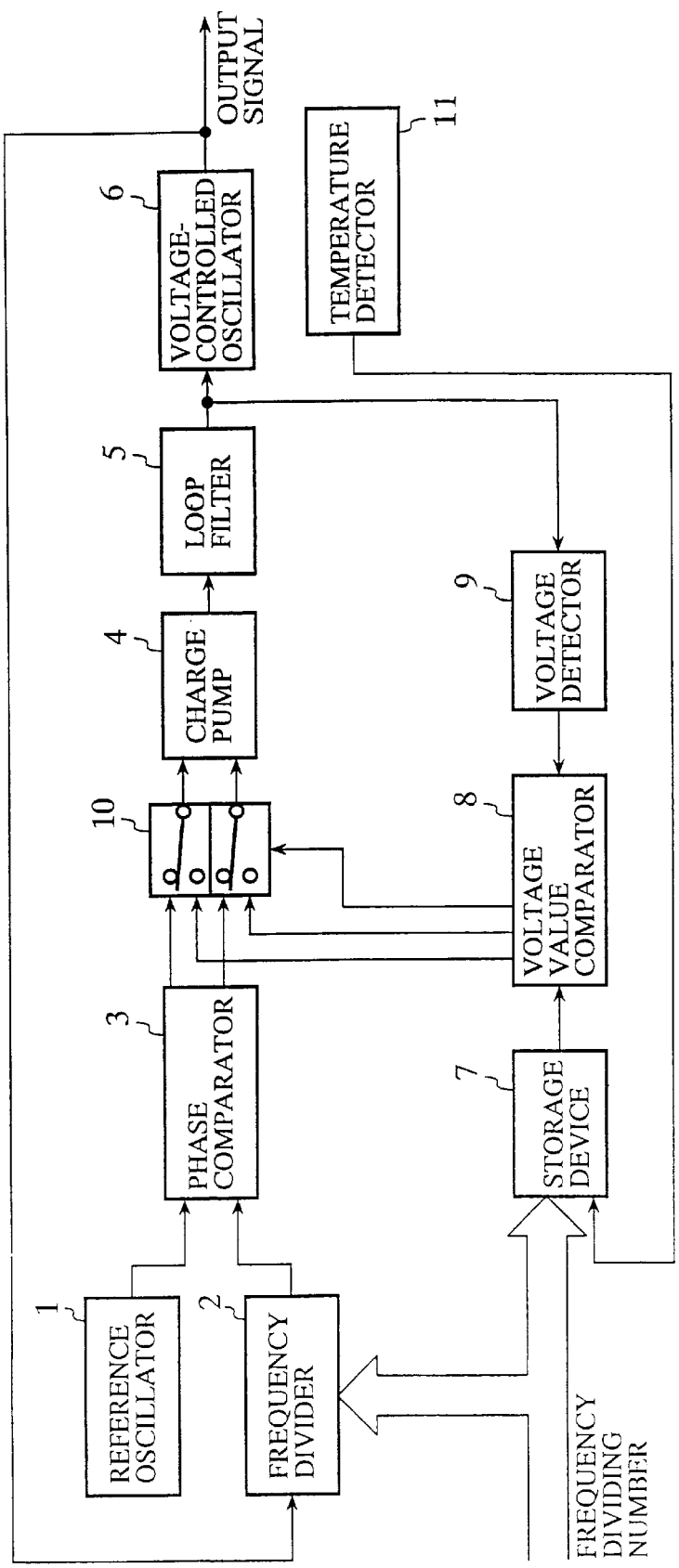
FIG. 3 is a block diagram illustrating a PLL frequency synthesizer according to Embodiment 2 of the present invention.

FIG. 3 is a block diagram depicting the construction of a PLL frequency synthesizer according to Embodiment 2 of the present invention. In FIG. 3, the same reference numerals as those in FIG. 1 denote the parts identical or corresponding to those therein; hence no description will be given of them. Reference numeral 11 denotes a temperature detector which detects the temperature of the voltage-controlled oscillator 6 or ambient temperature and sends the temperature information to the storage device 7.

The control voltage applied to the voltage-controlled oscillator 6 and the frequency of the output signal therefrom uniquely correspond to each other under certain conditions, but a change in temperature or some other conditions will change their correspondence as well. With the construction of Embodiment 1 described above, for example, when the temperature of the voltage-controlled oscillator 6 changes, the correspondence between each set value of the frequency dividing number stored in the storage device 7 and each set value of the control voltage may sometimes deviate from their actual correspondence, incurring the possibility of the response to frequency switching slowing down. Moreover, when the deviation in their correspondence exceeds a threshold value of the voltage value comparator 8, there is a real chance of the convergence to a desired frequency becoming an impossibility. As a solution to such a problem, the PLL frequency synthesizer according to Embodiment 2 is equipped with the temperature compensating feature in addition to the above-described construction of Embodiment 1.

Next, the operation of this embodiment will be described below.

Premeasurements are made on the correspondence between a plurality of set values of frequency dividing numbers and a plurality of set values of control voltages to the voltage-controlled oscillator 6 under a plurality of conceivable temperature conditions, and a table indicating the correspondence is prestored in the storage device 7. And, when supplied with the same value as the frequency dividing number to be fed to the frequency divider 2, the storage device 7 reads out of the prestored table the set value of the control voltage that corresponds to the set frequency dividing number and the temperature information provided from the temperature detector 11, and outputs the read-out set value to the voltage value comparator 8. And, as in Embodiment 1 described above, the voltage detector 8 detects and outputs the current value of the control voltage applied from the loop filter 5 to the voltage-controlled oscillator 6. The voltage value comparator 8 compares the set value of the control voltage input thereinto from the storage device 7, corresponding to the set frequency dividing number and the temperature information available from the temperature detector 11, and the set value of the control voltage input thereinto from the voltage detector 9; when the difference is greater than a predetermined threshold value, the voltage value comparator 8 switches the switching circuit 10 to connect the input of the charge pump 4 to the output of the comparator. The voltage value comparator 8 drives the charge pump 4 in such a manner as to reduce the difference between the set value of the control voltage provided from the storage device 7 and the current value of the control voltage detected by the voltage detector 9 and hence change the control voltage to be fed from the loop filter 5 to the voltage-controlled oscillator 6 accordingly, thereby bringing the output frequency of the voltage-controlled oscillator 6 close to the desired frequency. When the difference between the set value of the control voltage read out of the storage device 7 and the current value of the control voltage detected by the voltage detector 9 becomes smaller than the predetermined threshold value, the voltage value comparator 8 switches the switching circuit 10 to connect the input of the charge pump 4 to the output of the phase comparator 8. As a result, the PLL frequency synthesizer according to Embodiment 2 is changed over to the same operating condition as is the case with the prior art example. Eventually the phase difference between the reference frequency signal from the reference oscillator 1 and the frequency-divided signal from the frequency divider 2 disappears, putting the PLL frequency synthesizer in its frequency-locked state. The frequency of the output signal from the voltage-controlled oscillator 6 at this time becomes equal to a value of multiplication of the frequency of the reference frequency signal by the frequency dividing number set in the frequency divider 2.

When the temperature of the voltage-controlled oscillator 6 or ambient temperature changes during operation, the storage device 7 changes the set value of the control voltage to be output to the voltage value comparator 8, based on the prestored table indicating the correspondence of the frequency dividing numbers with the control voltage values to be fed to the voltage-controlled oscillator 6 and temperature conditions. Thereafter, as described above, when the difference between the set value of the control voltage fed from the storage device 7 and the current value of the control voltage detected by the voltage detector 9 is greater than a predetermined threshold value, the voltage value comparator 8 drives the charge pump 4 in such a manner as to reduce the difference and hence change the control voltage to be fed from the loop filter 5 to the voltage-controlled oscillator 6 accordingly, thereby bringing its output frequency close to the desired frequency.

As described above, according to Embodiment 2, even if the temperature of the voltage-controlled oscillator 6 or ambient temperature changes during operation, it is possible to prevent the synthesizer from becoming impossible of getting frequency-locked and maintain a quick response to frequency switching.

Moreover, a condition other than temperature can also be used as a parameter; a compensating feature similar to that described above could be added by prestoring in the storage device 7 a table indicting the correspondence of the parameter, the frequency dividing number and the control voltage value and by providing means for detecting the condition.

Embodiment 3

Figure 4:
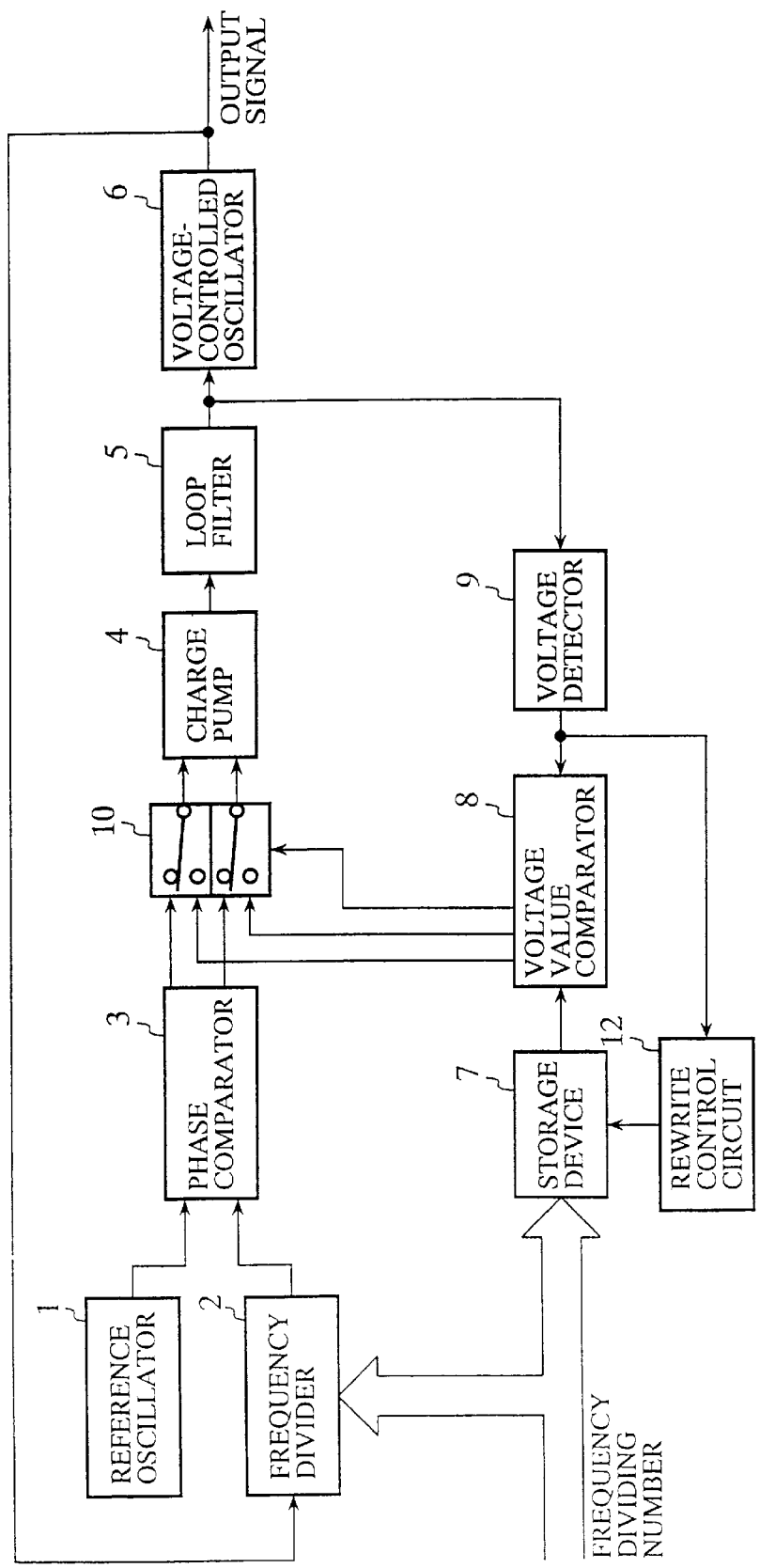
FIG. 4 is a block diagram illustrating a PLL frequency synthesizer according to Embodiment 3 of the present invention.

FIG. 4 is a block diagram depicting the construction of a PLL frequency synthesizer according to Embodiment 3 of the present invention. In FIG. 4, the same reference numerals as those in FIG. 1 denote the parts identical or corresponding to those therein; hence no description will be given of them. Reference numeral 12 denotes a rewrite control circuit (rewrite control means) whereby, when the system has reached its frequency-locked state, the set value of the control voltage read out of the table in the storage device 7 and provided to the voltage value comparator 8 is updated with the current value of the control voltage detected by the voltage detector 9.

The PLL frequency synthesizer according to Embodiment 3 has, in addition to the construction of Embodiment 1, a function of correcting for a change in the system characteristic which occurs when the correspondence between the frequency dividing number set in the frequency divider 2 for obtaining a desired frequency and the control voltage value necessary for the voltage-controlled oscillator 6 to provide an output of the desired frequency deviates from their correspondence prestored in the storage device 7, for example, by a secular change of the voltage-controlled oscillator 6 or the like.

Next, the operation of this embodiment will be described below.

As in Embodiment 1 described above, there is prestored in the storage device 7 a table indicating the correspondence between a plurality of set values of frequency dividing numbers to be selectively set in the frequency divider 2 for obtaining the desired frequency and a plurality of set values of the control voltages to be selectively applied to the voltage-controlled oscillator 6 for obtaining therefrom the output of the desired frequency. When supplied with the same value as the frequency dividing number to be provided to the frequency divider 2, the storage device 7 reads out of the table the set value of the control voltage corresponding to the set frequency dividing number, and provides the read-out value to the voltage value comparator 8. On the other hand, the voltage detector 9 detects the current value of the control voltage applied from the loop filter 5 to the voltage-controlled oscillator 6 and outputs the detected value to the voltage value comparator 8. The voltage value comparator 8 compares the set value of the control voltage input thereinto from the storage device 7 and the current value of the control voltage detected by the voltage detector 9. When the difference is greater than the predetermined threshold value, the switching circuit 10 is switched to connect the input of the charge pump 4 to the output of the voltage value comparator 8. The voltage value comparator 8 drives the charge pump 4 in such a manner as to reduce the difference between the set value of the control voltage provided from the storage device 7 and the current value of the control voltage detected by the voltage detector 9 and hence change the control voltage applied from the loop filter 5 to the voltage-controlled oscillator 6, by which the frequency of the output signal from the voltage-controlled oscillator 6 is brought close to the desired frequency. When the difference between the set value of the control voltage read out of the storage device 7 and the current value of the control voltage detected by the voltage detector 9 becomes smaller than the predetermined threshold value, the voltage value comparator 8 switches the switching circuit 10 to connect the input of the charge pump 4 to the output of the phase comparator 8. As a result, the PLL frequency synthesizer according to Embodiment 3 is changed over to the same operating condition as is the case with the prior art example. Eventually the phase difference between the reference frequency signal from the reference oscillator 1 and the frequency-divided signal from the frequency divider 2 disappears, putting the PLL frequency synthesizer in its frequency-locked state. The frequency of the output signal from the voltage-controlled oscillator 6 at this time becomes equal to a value of multiplication of the frequency of the reference frequency signal by the frequency dividing number set in the frequency divider 2.

When the system has thus reached its frequency-locked state, the rewrite control circuit 12 uses the current value of the control voltage detected by the voltage detector 9 to update that one of the set values of the control voltages in the table in the storage device read out therefrom and fed to the voltage comparator 8. In this way, the latest correspondence between each set value of the control voltage provided to the voltage-controlled oscillator for obtaining the desired frequency and each set value of the frequency dividing number is always stored in the storage device 7. This permits automatic correction for changes in the system characteristics by aging.

As described above, according to Embodiment 3, it is possible to implement a fast frequency switching response while suppressing the phase noise and spurious components and automatically correct for secular changes in the system characteristics.

Embodiment 4

Figure 5:
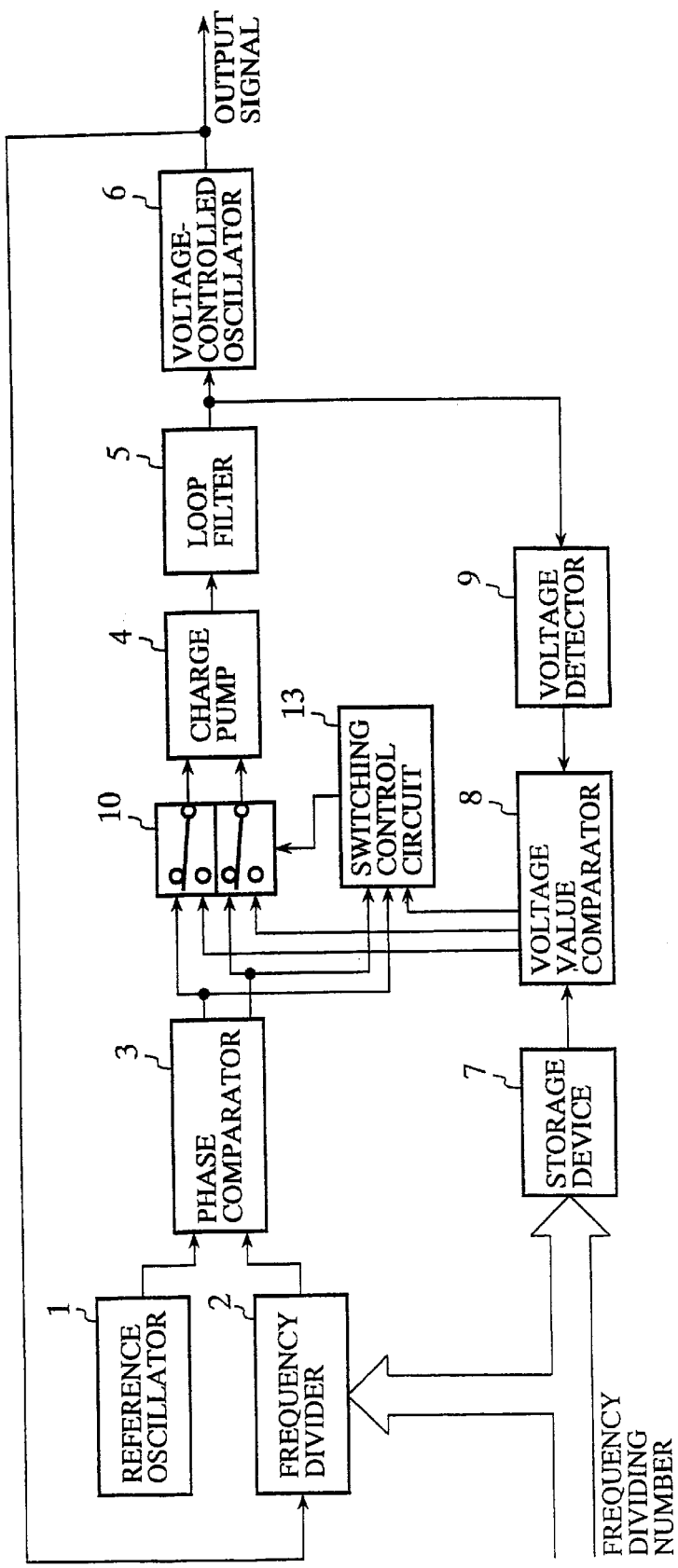
FIG. 5 is a block diagram illustrating a PLL frequency synthesizer according to Embodiment 4 of the present invention.

FIG. 5 is a block diagram depicting the construction of a PLL frequency synthesizer according to Embodiment 4 of the present invention. In FIG. 5, the same reference numerals as those in FIG. 1 denote the parts identical or corresponding to those therein; hence no description will be given of them. Reference numeral 13 denotes a switching control circuit (control means) which, when supplied with a switching instruction from the voltage value comparator 8, drives the switching circuit 10 to switch the connection of the input of the charge pump 4 from the voltage value comparator 8 to the phase comparator 3 at the instant when the output from the phase comparator 3 indicates that the reference frequency signal from the reference oscillator 1 has become in-phase with the frequency-divided signal from the frequency divider 2.

The PLL frequency synthesizer according to Embodiment 4 has, in addition to the above-described construction of Embodiment 1, the switching control circuit 13 for suppressing fluctuations in the control voltage which may be caused by switching the input of the charge pump 4 from the voltage value comparator 8 to the phase comparator 3.

Next, the operation of this embodiment will be described below.

As in Embodiment 1 described above, there is prestored in the storage device 7 a table indicating the correspondence between a plurality of set values of frequency dividing numbers to be selectively set in the frequency divider 2 for obtaining the desired frequency and a plurality of set values of the control voltages to be selectively applied to the voltage-controlled oscillator 6 for obtaining therefrom the output of the desired frequency. When supplied with the same value as the frequency dividing number to be provided to the frequency divider 2, the storage device 7 reads out of the table the set value of the control voltage corresponding to the set frequency dividing number, and provides the read-out value to the voltage value comparator 8. On the other hand, the voltage detector 9 detects the current value of the control voltage applied from the loop filter 5 to the voltage-controlled oscillator 6 and outputs the detected value to the voltage value comparator 8. The voltage value comparator 8 compares the set value of the control voltage input thereinto from the storage device 7 and the current value of the control voltage detected by the voltage detector 9. When the difference is greater than the predetermined threshold value, the switching circuit 10 is switched to connect the input of the charge pump 4 to the output of the voltage value comparator 8. The voltage value comparator 8 drives the charge pump 4 in such a manner as to reduce the difference between the set value of the control voltage provided from the storage device 7 and the current value of the control voltage detected by the voltage detector 9 and hence change the control voltage applied from the loop filter 5 to the voltage-controlled oscillator 6, by which the frequency of the output signal from the voltage-controlled oscillator 6 is brought close to the desired frequency.

When the difference between the set value of the control voltage read out of the storage device 7 and the current value of the control voltage detected by the voltage detector 9 becomes smaller than a predetermined threshold value during the frequency-locking process, the voltage value comparator 8 outputs a switching instruction signal to the switching circuit 13. Supplied with the switching instruction signal, the switching control circuit 13 drives the switching circuit 10 to switch the connection of the input of the charge pump 4 from the voltage value comparator 8 to the phase comparator 3 at the instant when the output from the phase comparator 3 indicates that the reference frequency signal from the reference oscillator 1 has become in-phase with the frequency-divided signal from the frequency divider 2. This operation smoothes the frequency-locking operation immediately following the connection of the input of the charge pump 4 to the phase comparator 3, making the frequency switching response faster. Incidentally, the switching control circuit 13, even if supplied with the switching instruction, controls the switching circuit 10 to keep the input of the charge pump 4 connected to the voltage value comparator 8 when the reference frequency signal from the reference oscillator 1 does not become in-phase with the frequency-divided signal from the frequency divider 2.

At the instant when the output from the phase comparator 3 indicates that the reference frequency signal from the reference oscillator 1 has become in-phase with the frequency-divided signal from the frequency divider 2, the PLL frequency synthesizer according to Embodiment 4 turns into the same operating condition as in the prior art example. Thus, the phase difference between the reference frequency signal from the reference oscillator 1 and the frequency-divided signal from the frequency divider 2 disappears, and the PLL frequency synthesizer enters its frequency-locked state. The frequency of the output signal from the voltage-controlled oscillator 6 at this time is equal to a value of multiplication of the frequency of the reference frequency signal by the frequency dividing number set in the frequency divider 2.

As described above, according to Embodiment 4, the switching control circuit 13 operates to suppress fluctuations in the control voltage which may occur when it drives the switching circuit 10 to supply the charge pump 4 with the phase difference signal from the phase comparator 3 in place of the output signal from the voltage value comparator 8—this makes smooth the frequency-locking operation immediately following the connection of the input of the charge pump 4 to the phase comparator 3, and consequently, the frequency switching response can be made faster.

Embodiment 5

Figure 6:
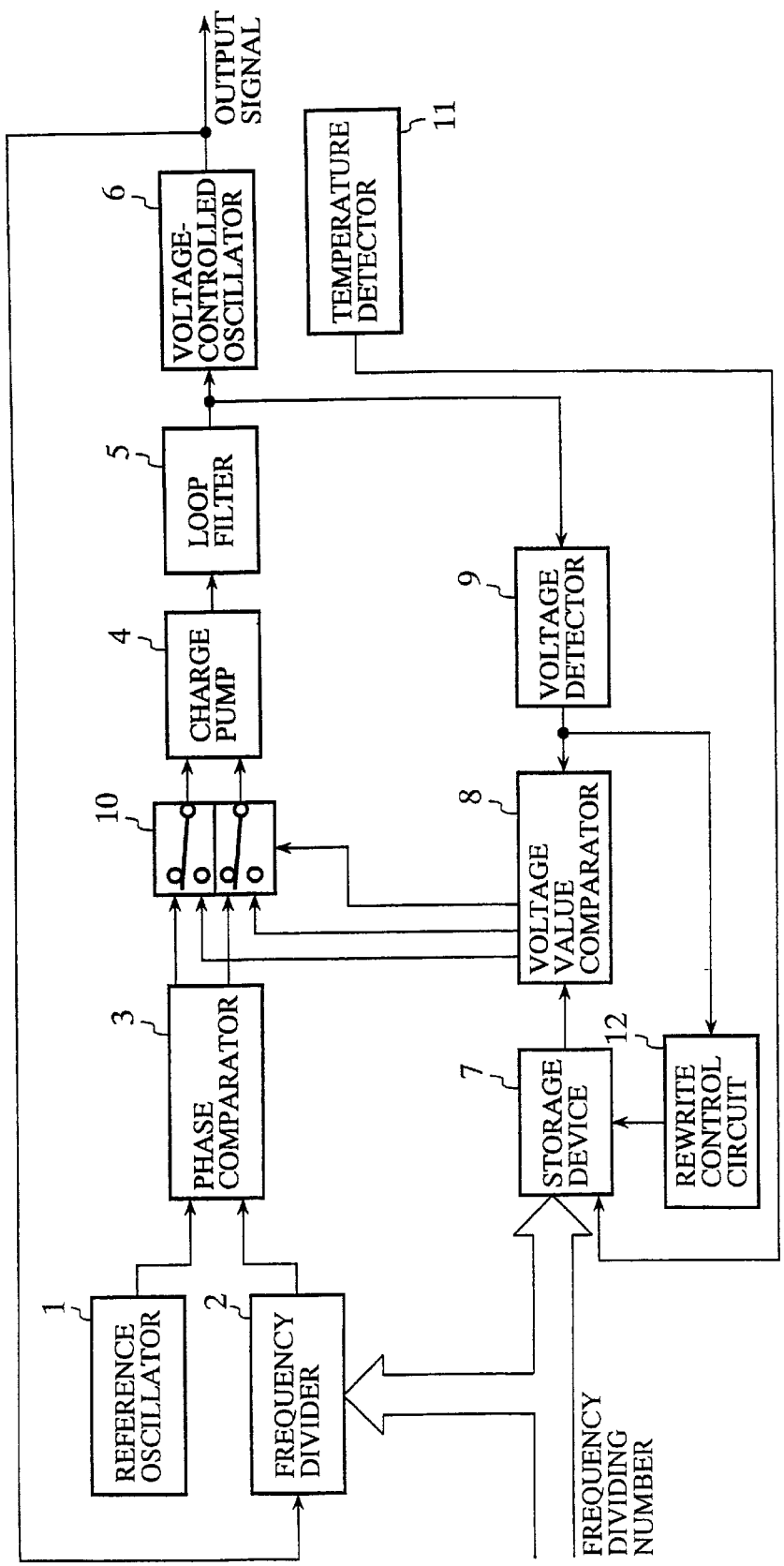
FIG. 6 is a block diagram illustrating a PLL frequency synthesizer according to Embodiment 5 of the present invention.

FIG. 6 is a block diagram depicting the construction of a PLL frequency synthesizer according to Embodiment 5 of the present invention. In FIG. 6, the same reference numerals as those in FIGS. 3 and 4 denote the parts identical or corresponding to those therein; hence no description will be given of them.

The PLL frequency synthesizer according to Embodiment 5 has a construction which combines the features of the PLL frequency synthesizers according to Embodiments 2 and 3 described above. That is, the PLL frequency synthesizer according to this embodiment comprises: the storage device 7 wherein there is prestored a table indicating the correspondence between a plurality set values of frequency dividing numbers to be selectively set in the frequency divider 2 for obtaining a desired frequency and a plurality of set values of control voltages to be selectively applied to the voltage-controlled oscillator 6 for obtaining the desired frequency; the voltage detector 9 for detecting the current value of the control voltage applied to the voltage-controlled oscillator 6; the voltage value comparator 8 which compares the set value of the control voltage input thereinto from the storage device 7 and the current value of the control voltage detected by the voltage detector 9 and, when the difference is greater than a predetermined threshold value, switches the switching circuit 10 to connect the input of the charge pump 4 to the output of the voltage value comparator itself; the temperature detector 11 which detects the temperature of the voltage-controlled oscillator 6 or ambient temperature and provides the temperature information to the storage device 7; and the rewrite control circuit 12 whereby the set value of the control voltage read out of the table in the storage device 7 and provided to the voltage value comparator 8 is updated with the current value of the control voltage detected by the voltage detector 9.

Next, the operation of this embodiment will be described below.

The basic operation of this embodiment is the same as the operation of the PLL frequency synthesizer according to Embodiment 2 described above. That is, based on the prestored table indicating the correspondence of the frequency dividing numbers with the control voltage values to be fed to the voltage-controlled oscillator 6 and temperature conditions, the storage device 7 reads out the set value of the control voltage to be output to the voltage value comparator 8. Thereafter, as described above, when the difference between the set value of the control voltage fed from the storage device 7 and the current value of the control voltage detected by the voltage detector 9 is greater than a predetermined threshold value, the voltage value comparator 8 drives the charge pump 4 in such a manner as to reduce the difference and hence change the control voltage to be fed from the loop filter 5 to the voltage-controlled oscillator 6 accordingly, thereby bringing its output frequency close to the desired frequency.

When the system has thus reached its frequency-locked state, the rewrite control circuit 12 uses the current value of the control voltage detected by the voltage detector 9 to update that one of the set values of the control voltages in the table in the storage device read out therefrom and fed to the voltage comparator 8 as in the case of Embodiment 3. In this way, the latest correspondence between each set value of the control voltage provided to the voltage-controlled oscillator for obtaining the desired frequency and each set value of the frequency dividing number is always stored in the storage device 7. This permits automatic correction for changes in the system characteristics by aging.

As described above, according to Embodiment 5, even if the temperature of the voltage-controlled oscillator 6 or ambient temperature changes during operation, it is possible to prevent the synthesizer from becoming impossible of getting frequency-locked and maintain a quick response to frequency switching. Moreover, a condition other than temperature can also be used as a parameter; a compensating function similar to that described above could be added by prestoring in the storage device 7 a table indicative of the correspondence of the parameter with the frequency dividing number and the control voltage value and providing means for detecting the condition.

Furthermore, according to Embodiment 5, it is possible to implement a fast frequency switching response while suppressing the phase noise and spurious components and automatically correct for secular changes in the system characteristics.

Embodiment 6

Figure 7:
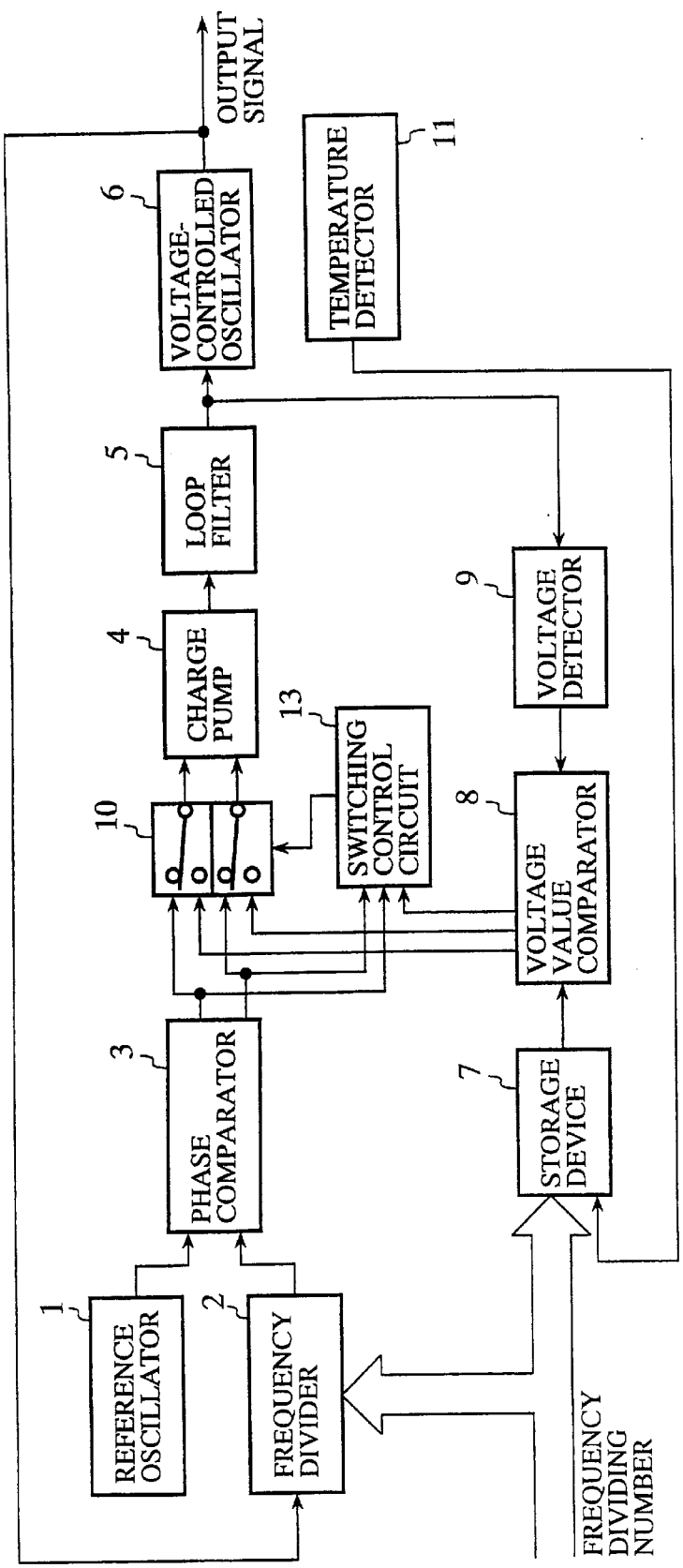
FIG. 7 is a block diagram illustrating a PLL frequency synthesizer according to Embodiment 6 of the present invention.

FIG. 7 is a block diagram depicting the construction of a PLL frequency synthesizer according to Embodiment 6 of the present invention. In FIG. 7, the same reference numerals as those in FIGS. 3 and 5 denote the parts identical or corresponding to those therein; hence no description will be given of them.

The PLL frequency synthesizer according to Embodiment 6 has a construction which combines the features of the PLL frequency synthesizers according to Embodiments 2 and 4 described above. That is, the PLL frequency synthesizer according to this embodiment comprises: the storage device 7 wherein there is prestored a table indicating the correspondence between a plurality set values of frequency dividing numbers to be selectively set in the frequency divider 2 for obtaining a desired frequency and a plurality of set values of control voltages to be selectively applied to the voltage-controlled oscillator 6 for obtaining the desired frequency; the voltage detector 9 for detecting the current value of the control voltage applied to the voltage-controlled oscillator 6; the voltage value comparator 8 which compares the set value of the control voltage input thereinto from the storage device 7 and the current value of the control voltage detected by the voltage detector 9 and, when the difference is greater than a predetermined threshold value, switches the switching circuit 10 to connect the input of the charge pump 4 to the output of the voltage value comparator itself; the temperature detector 11 which detects the temperature of the voltage-controlled oscillator 6 or ambient temperature and provides the temperature information to the storage device 7; and the switching control circuit 13 which, when supplied with a switching instruction from the voltage value comparator 8, drives the switching circuit 10 to switch the connection of the input of the charge pump 4 from the voltage value comparator 8 to the phase comparator 3 at the instant when the output from the phase comparator 3 indicates that the reference frequency signal from the reference oscillator 1 has become in-phase with the frequency-divided signal from the frequency divider 2.

Next, the operation of this embodiment will be described below.

The basic operation of this embodiment is the same as the operation of the PLL frequency synthesizer according to Embodiment 2 described above. That is, based on the prestored table indicating the correspondence of the frequency dividing numbers, the control voltage values to be fed to the voltage-controlled oscillator 6 and temperature conditions, the storage device 7 reads out the set value of the control voltage to be output to the voltage value comparator 8. Thereafter, as described above, when the difference between the set value of the control voltage fed from the storage device 7 and the current value of the control voltage detected by the voltage detector 9 is greater than a predetermined threshold value, the voltage value comparator 8 drives the charge pump 4 in such a manner as to reduce the difference and hence change the control voltage to be fed from the loop filter 5 to the voltage-controlled oscillator 6 accordingly, thereby bringing its output frequency close to the desired frequency.

When the difference between the set value of the control voltage read out of the storage device 7 and the current value of the control voltage detected by the voltage detector 9 becomes smaller than the predetermined threshold value, the voltage value comparator 8 outputs a switching instruction signal to the switching circuit 13 as in the case of Embodiment 4. Supplied with the switching instruction signal, the switching control circuit 13 drives the switching circuit 10 to switch the connection of the input of the charge pump 4 from the voltage value comparator 8 to the phase comparator 3 at the instant when the output from the phase comparator 3 indicates that the reference frequency signal from the reference oscillator 1 has become in-phase with the frequency-divided signal from the frequency divider 2. This operation makes smooth the frequency-locking operation immediately following the connection of the input of the charge pump 4 to the phase comparator 3, making the frequency switching response faster.

As described above, according to Embodiment 6, even if the temperature of the voltage-controlled oscillator 6 or ambient temperature changes during operation, it is possible to prevent the synthesizer from becoming impossible of getting frequency-locked and maintain the fast response to frequency switching. Moreover, a condition other than temperature can also be used as a parameter; a compensating function similar to that described above could be added by prestoring in the storage device 7 a table indicating the correspondence of the parameter, the frequency dividing number and the control voltage value and by providing means for detecting the condition.

Furthermore, according to Embodiment 6, by suppressing fluctuations in the control voltage which may result from driving the switching circuit 10, it is possible to make smooth the frequency-locking operation immediately following the connection of the input of the charge pump 4 to the phase comparator 3, and consequently, the frequency switching response can be made faster.

Embodiment 7

Figure 8:
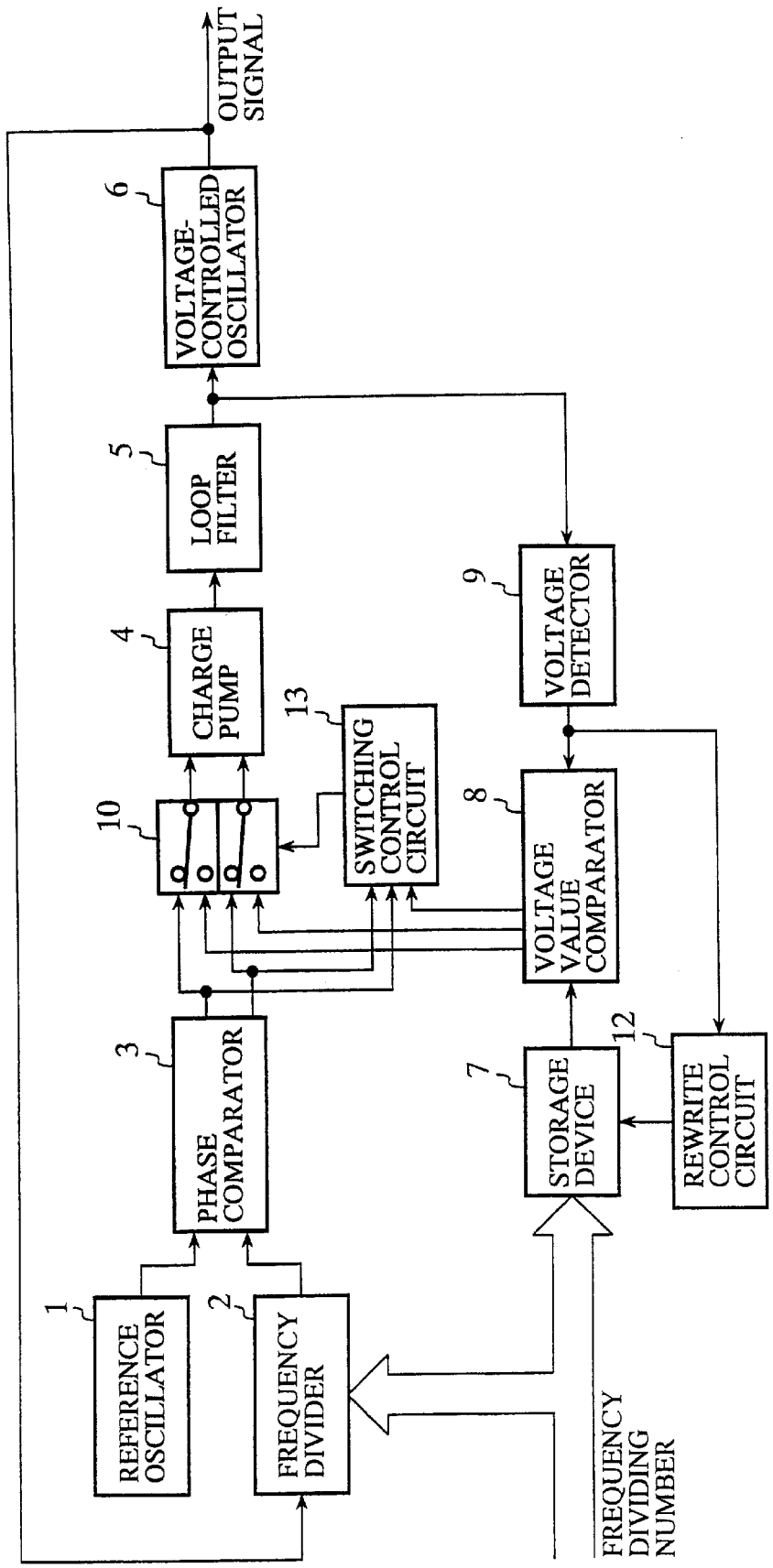
FIG. 8 is a block diagram illustrating a PLL frequency synthesizer according to Embodiment 7 of the present invention.

FIG. 8 is a block diagram depicting the construction of a PLL frequency synthesizer according to Embodiment 7 of the present invention. In FIG. 8, the same reference numerals as those in FIGS. 4 and 5 denote the parts identical or corresponding to those therein; hence no description will be given of them.

The PLL frequency synthesizer according to Embodiment 7 has a construction which combines the features of the PLL frequency synthesizers according to Embodiments 3 and 4 described above. That is, the PLL frequency synthesizer according to this embodiment comprises: the storage device 7 wherein there is prestored a table indicating the correspondence between a plurality set values of frequency dividing numbers to be selectively set in the frequency divider 2 for obtaining a desired frequency and a plurality of set values of control voltages to be selectively applied to the voltage-controlled oscillator 6 for obtaining the desired frequency; the voltage detector 9 for detecting the current value of the control voltage applied to the voltage-controlled oscillator 6; the voltage value comparator 8 which compares the set value of the control voltage input thereinto from the storage device 7 and the current value of the control voltage detected by the voltage detector 9 and, when the difference is greater than a predetermined threshold value, switches the switching circuit 10 to connect the input of the charge pump 4 to the output of the voltage value comparator itself; the rewrite control circuit 12 whereby the set value of the control voltage read out of the table in the storage device 7 and provided to the voltage value comparator 8 is updated with the current value of the control voltage detected by the voltage detector 9; and the switching control circuit 13 which, when supplied with a switching instruction from the voltage value comparator 8, drives the switching circuit 10 to switch the connection of the input of the charge pump 4 from the voltage value comparator 8 to the phase comparator 3 at the instant when the output from the phase comparator 3 indicates that the reference frequency signal from the reference oscillator 1 has become in-phase with the frequency-divided signal from the frequency divider 2.

Next, the operation of this embodiment will be described below.

The basic operation of this embodiment is the same as the operation of the PLL frequency synthesizer according to Embodiment 4 described above. That is, when the difference between the set value of the control voltage read out of the storage device 7 and the current value of the control voltage detected by the voltage detector 9 becomes smaller than the predetermined threshold value, the voltage value comparator 8 outputs a switching instruction signal to the switching circuit 13 as in the case of Embodiment 4. Supplied with the switching instruction signal, the switching control circuit 13 drives the switching circuit 10 to switch the connection of the input of the charge pump 4 from the voltage value comparator 8 to the phase comparator 3 at the instant when the output from the phase comparator 3 indicates that the reference frequency signal from the reference oscillator 1 has become in-phase with the frequency-divided signal from the frequency divider 2. This operation makes smooth the frequency-locking operation immediately following the connection of the input of the charge pump 4 to the phase comparator 3, making the frequency switching response faster.

When the system has thus reached its frequency-locked state, the rewrite control circuit 12 uses the current value of the control voltage detected by the voltage detector 9 to update that one of the set values of the control voltages in the table in the storage device read out therefrom and fed to the voltage comparator 8 as in the case of Embodiment 3. In this way, the latest correspondence between each set value of the control voltage provided to the voltage-controlled oscillator for obtaining the desired frequency and each set value of the frequency dividing number is always stored in the storage device 7. This permits automatic correction for changes in the system characteristics by aging.

As described above, according to Embodiment 7, by suppressing fluctuations in the control voltage which may result from driving the switching circuit 10, it is possible to make smooth the frequency-locking operation immediately following the connection of the input of the charge pump 4 to the phase comparator 3, and consequently, the frequency switching response can be made faster.

Moreover, according to Embodiment 7, it is possible to implement a fast frequency switching response while suppressing the phase noise and spurious components and automatically correct for secular changes in the system characteristics.

Embodiment 8

Figure 9:
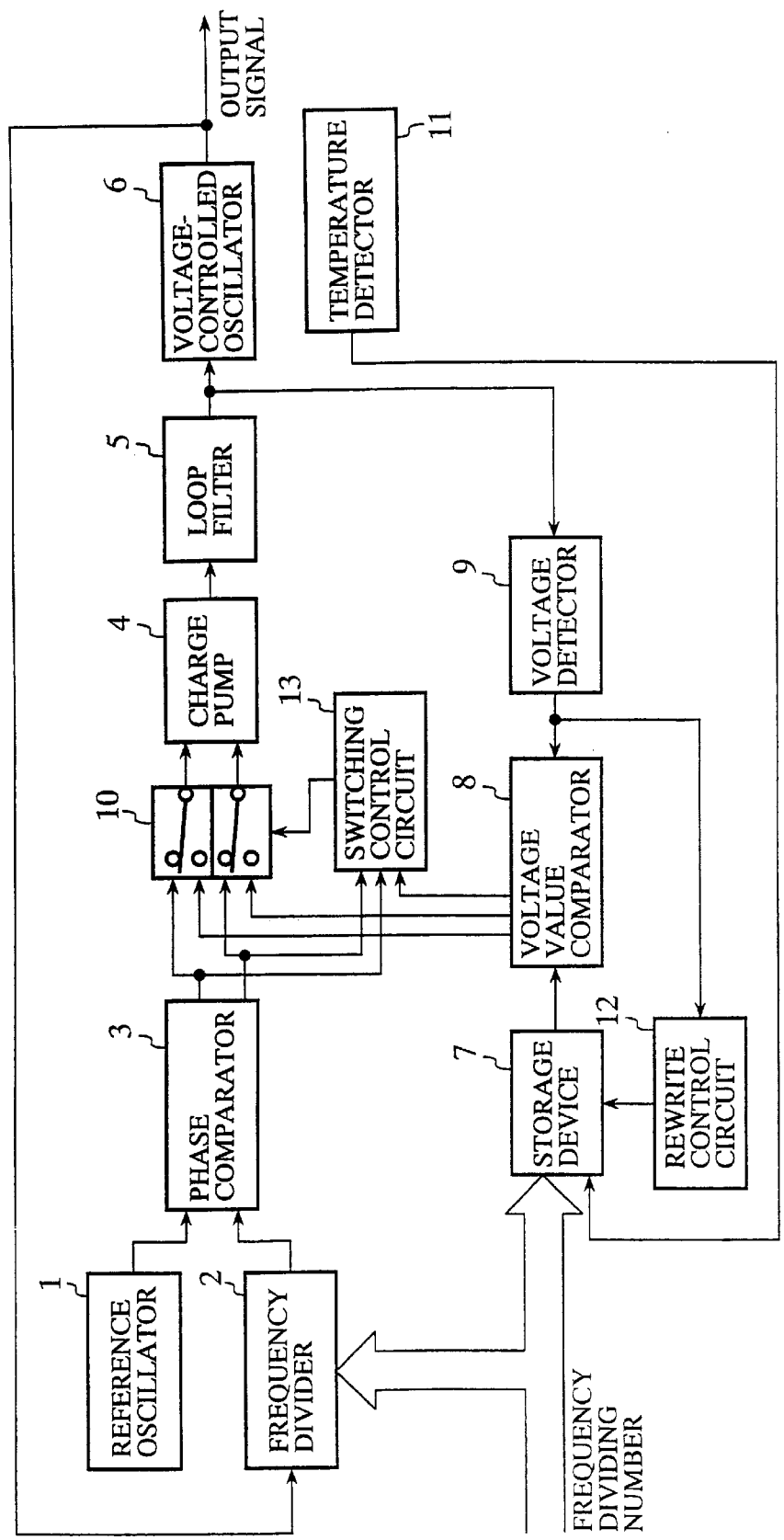
FIG. 9 is a block diagram illustrating a PLL frequency synthesizer according to Embodiment 8 of the present invention.

FIG. 9 is a block diagram depicting the construction of a PLL frequency synthesizer according to Embodiment 8 of the present invention. In FIG. 9, the same reference numerals as those in FIGS. 3 through 5 denote the parts identical or corresponding to those therein; hence no description will be given of them.

The PLL frequency synthesizer according to Embodiment 8 has a construction which combines the features of the PLL frequency synthesizers according to Embodiments 2 through 5 described above. That is, the PLL frequency synthesizer according to this embodiment comprises: the storage device 7 wherein there is prestored a table indicating the correspondence between a plurality set values of frequency dividing numbers to be selectively set in the frequency divider 2 for obtaining a desired frequency and a plurality of set values of control voltages to be selectively applied to the voltage-controlled oscillator 6 for obtaining the desired frequency; the voltage detector 9 for detecting the current value of the control voltage applied to the voltage-controlled oscillator 6; the voltage value comparator 8 which compares the set value of the control voltage input thereinto from the storage device 7 and the current value of the control voltage detected by the voltage detector 9 and, when the difference is greater than a predetermined threshold value, switches the switching circuit 10 to connect the input of the charge pump 4 to the output of the voltage value comparator itself; the temperature detector 11 which detects the temperature of the voltage-controlled oscillator 6 or ambient temperature and sends the temperature information to the storage device 7;

the rewrite control circuit 12 whereby the set value of the control voltage read out of the table in the storage device 7 and provided to the voltage value comparator 8 is updated with the current value of the control voltage detected by the voltage detector 9; and the switching control circuit 13 which, when supplied with a switching instruction from the voltage value comparator 8, drives the switching circuit 10 to switch the connection of the input of the charge pump 4 from the voltage value comparator 8 to the phase comparator 3 at the instant when the output from the phase comparator 3 indicates that the reference frequency signal from the reference oscillator 1 has become in-phase with the frequency-divided signal from the frequency divider 2.

Next, the operation of this embodiment will be described below.

The basic operation of this embodiment is the same as the operation of the PLL frequency synthesizer according to Embodiment 2 described above. That is, based on the prestored table indicating the correspondence of the frequency dividing numbers, the control voltage values to be fed to the voltage-controlled oscillator 6 and temperature conditions, the storage device 7 reads out the set value of the control voltage to be output to the voltage value comparator 8. Thereafter, as described above, when the difference between the set value of the control voltage fed from the storage device 7 and the current value of the control voltage detected by the voltage detector 9 is greater than a predetermined threshold value, the voltage value comparator 8 drives the charge pump 4 in such a manner as to reduce the difference and hence change the control voltage to be fed from the loop filter 5 to the voltage-controlled oscillator 6 accordingly, thereby bringing its output frequency close to the desired frequency.

When the difference between the set value of the control voltage read out of the storage device 7 and the current value of the control voltage detected by the voltage detector 9 becomes smaller than the predetermined threshold value, the voltage value comparator 8 outputs a switching instruction signal to the switching circuit 13 as in the case of Embodiment 4. Supplied with the switching instruction signal, the switching control circuit 13 drives the switching circuit 10 to switch the connection of the input of the charge pump 4 from the voltage value comparator 8 to the phase comparator 3 at the instant when the output from the phase comparator 3 indicates that the reference frequency signal from the reference oscillator 1 has become in-phase with the frequency-divided signal from the frequency divider 2. This operation makes smooth the frequency-locking operation immediately following the connection of the input of the charge pump 4 to the phase comparator 3, making the frequency switching response faster.

When the system has thus reached its frequency-locked state, the rewrite control circuit 12 uses the current value of the control voltage detected by the voltage detector 9 to update that one of the set values of the control voltages in the table in the storage device read out therefrom and fed to the voltage comparator 8 as in the case of Embodiment 3. In this way, the latest correspondence between each set value of the control voltage provided to the voltage-controlled oscillator for obtaining the desired frequency and each set value of the frequency dividing number is always stored in the storage device 7. This permits automatic correction for changes in the system characteristics by aging.

As described above, according to Embodiment 8, even if the temperature of the voltage-controlled oscillator 6 or ambient temperature changes during operation, it is possible to prevent the synthesizer from becoming impossible of getting frequency-locked and maintain the fast response to frequency switching. Moreover, a condition other than temperature can also be used as a parameter; a compensating function similar to that described above could be added by prestoring in the storage device 7 a table indicating the correspondence of the parameter, the frequency dividing number and the control voltage value and by providing means for detecting the condition.

Furthermore, according to Embodiment 8, by suppressing fluctuations in the control voltage which may result from driving the switching circuit 10, it is possible to make smooth the frequency-locking operation immediately following the connection of the input of the charge pump 4 to the phase comparator 3, and consequently, the frequency switching response can be made faster.

Besides, according to Embodiment 8, it is possible to implement a fast frequency switching response while suppressing the phase noise and spurious components and automatically correct for secular changes in the system characteristics.

Industrial Applicability

As described above, the PLL frequency synthesizer according to the present invention is fit for achieving high frequency stability in its frequency-locked state through fast frequency switching while suppressing phase noise and neighboring spurious components in a cellular or similar mobile telephone.

What is claimed is:

1. A PLL frequency synthesizer comprising: a reference oscillator for generating a reference frequency signal having a reference frequency; a voltage-controlled oscillator which generates an output signal of a frequency corresponding to a control voltage applied thereto; a frequency divider which divides, based on the frequency number set therein, the frequency of said output signal from said voltage-controlled oscillator to generate a frequency-divided signal; a phase comparator which compares the phase of said frequency-divided signal from said frequency divider and the phase of said reference frequency signal and outputs a phase difference signal indicating their phase difference; voltage detecting means for detecting the present value of said control voltage; storage means which has prestored therein a table indicating the correspondence between a plurality of set values of frequency dividing numbers to be set in said frequency divider and a plurality of set values of control voltages to be applied to said voltage-controlled oscillator and which reads out of said table the set value of the control voltage corresponding to the frequency dividing number set in said frequency divider and outputs said read-out set value; a charge pump which is driven by a signal applied thereto to charge and discharge electric charges; a loop filter which integrates an output from said charge pump to generate said control voltage for application to said voltage-controlled oscillator; voltage value comparison means which compares the present value of said control voltage detected by said voltage detecting means and said set value of the control voltage output from said storage means, outputs the comparison result and generates an output signal corresponding to said set value; switching means which switches said phase difference signal from said phase comparator and said output signal from said voltage value comparison means to output either one of them to said charge pump; and control means which controls said switching means to drive said charge pump by said output signal from said voltage value comparison means when said comparison result indicates that the difference between the detected current value of said control voltage and said set value of the control voltage read out of said storage means is greater than a predetermined value, and at all other times, by said phase difference signal from said phase comparator.

2. The PLL frequency synthesizer according to claim 1, characterized in that it further comprises temperature detecting means for detecting the temperature of said voltage-controlled oscillator or ambient temperature, and in that said storage means has prestored therein a table indicating the correspondence of said plurality of set values of frequency dividing numbers and said plurality of set values of control voltages with a plurality of temperature conditions, and reads out of said table the set value of said control voltage corresponding to temperature information from said temperature detecting means and the frequency dividing number being set and provides said read-out set value to said voltage value comparison means.

3. The PLL frequency synthesizer according to claim 1, characterized in that it further comprises rewrite control means whereby, when said PLL frequency synthesizer has reached its phase-locked state, said set value of said control voltage stored in said storage device, which corresponds to the currently set frequency dividing number, is rewritten with the present value of said control voltage provided from said voltage detecting means.

4. The PLL frequency synthesizer according to claim 2, characterized in that, after the difference between said current value of said control voltage detected by said voltage detecting means and said set value of said control voltage provided from said storage means is smaller than a predetermined value, said control means controls said switching means to drive said charge pump by said phase difference signal from said phase comparator only when said frequency-divided signal and said reference frequency signal have become in-phase with each other.

5. A method for controlling a PLL frequency synthesizer which has: a reference oscillator for generating a reference frequency signal of a reference frequency; a voltage-controlled oscillator which generates an output signal of a frequency corresponding to the control voltage applied thereto; a frequency divider which divides, based on the frequency number set therein, the frequency of said output signal from said voltage-controlled oscillator to generate a frequency-divided signal; a phase comparator which compares the phase of said frequency-divided signal from said frequency divider and the phase of said reference frequency signal and outputs a phase difference signal indicating their phase difference; a charge pump which is driven by said phase difference signal to charge and discharge electric charges; and a loop filter which integrates the output from said charge pump to generate said control voltage for application to said voltage-controlled oscillator; said method comprising: a control voltage detecting step of detecting the present value of said control voltage; a storing step of prestoring a table indicating the correspondence between a plurality of set values of frequency dividing numbers to be set in said frequency divider and a plurality of set values of control voltages to be applied to said voltage-controlled oscillator; a readout step of reading out of said prestored table the set value of said control voltage corresponding to the frequency dividing number currently set in said frequency divider; a comparison step of comparing said readout set value and the detected present value of said control voltage; and a charge pump driving step of driving said charge pump by a signal of a value corresponding to said set value of said control voltage in place of said phase difference signal from said phase comparator when it is found in said comparison step that the difference between the present value of said control voltage and said set value of said control voltage is larger than a predermined value, and at all other times, by said phase difference signal from the phase comparator.

6. The PLL frequency synthesizer control method according to claim 5, characterized in that it further comprises a step of detecting the temperature of said voltage-controlled oscillator or ambient temperature, and in that said storing step is a step of prestoring a table indicating the correspondence of a plurality of set values of said frequency dividing numbers and a plurality of set values of said control voltages with a plurality of temperature conditions, and said readout step is a step of reading out of said prestored table the set value of said control voltage corresponding to detected temperature and the currently set frequency dividing number.

7. The PLL frequency synthesizer control method according to claim 5, characterized in that it further comprises a rewriting step of rewriting said stored set value of said control voltage corresponding to the currently set frequency dividing number with the detected present value of said control voltage when said PLL frequency synthesizer has reached its phase-locked state.

8. The PLL frequency synthesizer control means according to claim 5, characterized in that said charge pump driving step is a step of driving said charge pump by said phase difference signal from said phase comparator only when said frequency-divided signal and said reference frequency signal have become in-phase with each other after the difference between the detected current value of said control voltage and said read-out set value of said control voltage became small.

9. A phase-locked loop (PLL) frequency synthesizer, comprising:

a voltage-controlled oscillator (VCO) for producing an output frequency signal in response to a control voltage signal applied thereto;

a control voltage signal generating circuit for generating said control voltage signal in response to a control input signal;

a reference oscillator for producing a reference frequency signal;

a frequency divider for receiving said output frequency signal from said VCO and dividing said signal by a frequency dividing integer value inputted to said frequency divider, to produce a frequency-divided output signal;

a phase comparator for comparing a phase of said reference frequency signal with a phase of said frequency-divided output signal, and for producing a difference signal corresponding to the difference therebetween as a first control input signal;

a storage device for storing control voltage values for said VCO corresponding to frequency dividing integer values, and for outputting a stored control voltage value corresponding to a frequency dividing integer value inputted to said frequency divider;

a voltage value comparator for comparing the control voltage value outputted by said storage device with the control voltage signal applied to said VCO, determining whether the difference between said control voltage value outputted by said storage device and the control voltage signal applied to said VCO as indicated by said comparison is greater than a predetermined threshold, producing a second control input signal corresponding to said control voltage value outputted by said storage device, applying said second control input signal to said control voltage signal generating circuit in place of said first control input signal if said difference is greater than said predetermined threshold, and allowing said first control input signal to be applied to said control voltage signal generating circuit if said difference is not greater than said predetermined threshold.

* * * * *

UNITED STATES PATENT AND TRADEMARK OFFICE
CERTIFICATE OF CORRECTION

PATENT NO. : 6,121,844  
DATED : September 19, 2000  
INVENTOR(S) : Suzuki

Page 1 of 1

It is certified that error appears in the above-identified patent and that said Letters Patent is hereby corrected as shown below:

Column 19, claim 5,
Line 40, delete "the" and insert -- a --.

Signed and Sealed this

Fifth Day of March, 2002

Attest:

JAMES E. ROGAN
*Attesting Officer*   *Director of the United States Patent and Trademark Office*